(12) United States Patent
Svenkeson

(10) Patent No.: US 10,149,415 B1
(45) Date of Patent: Dec. 4, 2018

(54) ELECTROMAGNETIC RADIATION SHIELDING ENHANCEMENT FOR EXPANSION CARD ENCLOSURES

(71) Applicant: EMC IP Holding Company LLC, Hopkinton, MA (US)

(72) Inventor: John Svenkeson, Bloomington, MN (US)

(73) Assignee: EMC IP HOLDING COMPANY LLC, Hopkinton, MA (US)

( * ) Notice: Subject to any disclaimer, the term of this patent is extended or adjusted under 35 U.S.C. 154(b) by 0 days.

(21) Appl. No.: 15/961,177

(22) Filed: Apr. 24, 2018

(51) Int. Cl.
*H05K 7/20* (2006.01)
*H05K 9/00* (2006.01)
*H05K 7/14* (2006.01)

(52) U.S. Cl.
CPC ......... *H05K 9/0062* (2013.01); *H05K 7/1417* (2013.01)

(58) Field of Classification Search
CPC ........... H05K 7/00; H05K 7/1007; H05K 7/12
See application file for complete search history.

(56) References Cited

U.S. PATENT DOCUMENTS

| | | | | |
|---|---|---|---|---|
| 6,953,910 B2 * | 10/2005 | Kautz | ...................... | H05K 7/12 219/201 |
| 8,593,828 B2 * | 11/2013 | Blackwell, Jr. | .......... | H05K 1/11 361/720 |
| 9,066,437 B2 * | 6/2015 | De Bruijn | ............ | G02B 6/4292 |

* cited by examiner

*Primary Examiner* — Anthony Q Edwards
(74) *Attorney, Agent, or Firm* — Amin, Turocy & Watson, LLP

(57) ABSTRACT

Described is a planar spring contact component coupled to a computer housing card enclosure that makes electrical contact with an inserted expansion card, to help form an electromagnetic shield around an opening in the card enclosure provided for external access to the expansion card. A planar spring contact component is electrically coupled to a conductive column that forms a first longitudinal side of an opening in a computer housing card enclosure. The planar spring contact component contacts a longitudinal side edge of a backplate surface panel of an expansion card when the expansion card is inserted into the card enclosure. The planar spring contact component deforms to force the opposite side edge of the backplate surface panel in a first planar direction, relative to a plane of the surface panel of the backplate, into an opposing shielding conductor, which may be a planar spring contact component of another conductive column.

20 Claims, 11 Drawing Sheets

US 10,149,415 B1

ELECTROMAGNETIC RADIATION SHIELDING ENHANCEMENT FOR EXPANSION CARD ENCLOSURES

TECHNICAL FIELD

The subject application relates to computing and electronic devices, and, for example, to reduce amounts of electromagnetic radiation that can emanate from a computing device.

BACKGROUND

To contain electromagnetic radiation (EMR, sometimes referred to as EMI for electromagnetic interference) in an electronics enclosure, such as a computer housing, an effective Faraday cage has to surround the emitting sources of radiation. In general, this is achieved by enclosing the emitting sources in a conductive enclosure and limiting the size of and shape of any openings in that enclosure to a size that will not pass significant levels of electromagnetic energy.

Peripheral Component Interface (PCI) and PCI Express® (PCIe®) refer to high speed computer interface bus standards with defined connector and interface panel ("backplate") mechanical form factors. Modules designed to this standard are more generally referred to as expansion cards, and generally comprise removable subassemblies designed to be easily installed or removed from an enclosure, sometimes in the form of a card cage, that holds the cards in place. When installed in the enclosure, the interface connections of the subassembly are typically accessible from the outside of the enclosure through the backplate. This allows external cabling and the like to be connected to a PCI/PCIe® module.

The size and shape of the openings in the enclosure that accept an expansion cards are defined by the industry standards, as is the conductive backplate (panel) that is the part of the module arranged to cover the opening in the enclosure when the PCI/PCIe module is installed. For state of the art electronics, and the radiating frequencies generated thereby, the conductive connection between the PCI/PCIe module's interface conductive panel and the conductive surfaces of the enclosure containing the associated openings, as defined by the industry standards, can be insufficient in suppressing the EMR radiating from the enclosure to acceptable levels.

SUMMARY

Briefly, one or more aspects of the technology described herein are directed towards a conductive column that forms a first longitudinal side of an opening in a computer housing card enclosure, and a planar spring contact component electrically coupled to the conductive column and that facilitates electrical contact between the first conductive column and a first longitudinal side edge of a backplate surface panel of an expansion card when the expansion card is inserted into the card enclosure. The planar spring contact deforms to force a second longitudinal side edge of the backplate surface panel in a first planar direction, relative to a plane of the surface panel of the conductive backplate, into an opposing shielding conductor.

Other embodiments may become apparent from the following detailed description when taken in conjunction with the drawings.

BRIEF DESCRIPTION OF THE DRAWINGS

The technology described herein is illustrated by way of example and not limited in the accompanying figures in which like reference numerals indicate similar elements and in which.

DETAILED DESCRIPTION

Various aspects of the technology described herein are generally directed towards spring loaded conductive components that compress and make electrical contact between the side edges of the conductive backplate (the module interface panel) and the enclosure columns that form the openings in the enclosure. As will be understood, the technology thus provides spring loaded points of contact that make contact with to the edges of the conductive backplate to force the side edges in the planar direction of the conductive backplate; as used herein, the spring contacts are referred to as "planar" spring contacts. The electrical connection between the conductive columns and the edges of the conductive backplate helps create a contiguous conductive boundary of a Faraday cage, which is desirable for the containment of electromagnetic radiation.

In one or more implementations, the technology can be combined with an existing solution in which contact is made in the orthogonal direction of the overlapping surfaces of the conductive columns and the conductive backplate. The combined planar spring contacts and orthogonal spring contacts can further suppress emission of electromagnetic radiation.

It should be understood that any of the examples herein are non-limiting. For instance, some of the examples show spaced apart, longitudinally arranged planar spring contacts that contact the longitudinal side edges of two different backplates; however as will be understood, as little as one single, longer longitudinally arranged planar spring contact can provide similar benefits. Further, one longitudinal edge of the backplate can be pressed into contact (via spring contact/force) so that the other longitudinal edge electrically contacts a shielding conductor or set of shielding conductors that is not necessarily a spring. Still further, the technology, description and drawings exemplify components at least generally based on the Peripheral Component Interface (PCI) and PCI Express® (PCIe®) standards, but the technology can be adapted to any similar concepts, standards and so on. As such, any of the embodiments, aspects, concepts, structures, functionalities or examples described herein are non-limiting, and the technology may be used in various ways that provide benefits and advantages in EMR/EMI shielding of electronics or other EMS sources in general.

Figure 1:
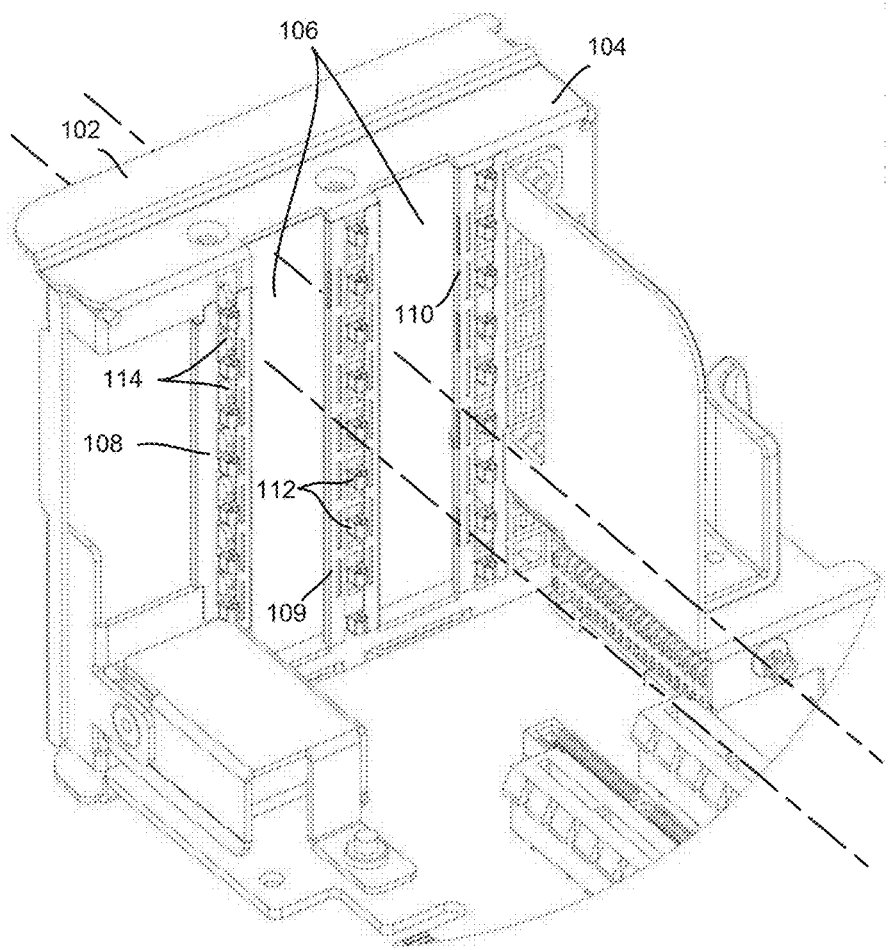
FIG. 1 is an example perspective, partial view representation of a computer housing that comprises an expansion card enclosure having conductive columns that define enclosure openings, in which the conductive columns include planar spring contacts to help prevent the escape of electromagnetic radiation, according to one or more example implementations.

FIG. 1 shows part of a computer housing 102, typically grounded, into which a card enclosure 104 is incorporated/electrically coupled thereto. The exemplified enclosure 104 includes a number of openings 106 formed by one or more conductive columns (three of which 108, 109 and 110 are shown), which are electrically connected to the computer housing 102/card enclosure 104. While two openings 106 are shown in FIG. 1, it is understood that any practical number may be present in a given implementation. Further, it is understood that the drawings are only for purposes of explanation, and are not intended to be to scale, convey any dimensions, relative dimensions and so on.

Note that the conductive columns can be stamped into part of the computer housing 102 or otherwise electrically coupled thereto, e.g., welded, bonded, fasted, screwed, etc. The enclosure 104 can be part of the computer housing, or a card cage or the like electrically coupled to the computer housing. For purposes of brevity, the term "computer housing card enclosure" is intended to represent any such arrangements, and include devices in which the conductive columns are directly formed as part of computer housing card enclosure (e.g., stamped) or separately manufactured and later coupled to the computer housing card enclosure.

As represented in FIG. 1, the conductive columns comprise a plurality of planar springs 112 (only two of which on column 109 are labeled for simplicity). To reiterate, these springs 112 are referred to herein as planar contact springs because they press the side edges of the expansion card backplate in directions that correspond to the plane of the backplate when an expansion card is inserted and the backplate's panel surface covers one of the openings 106 in the enclosure 104; (FIG. 2 shows a backplate 221 with a planar panel surface 222).

One or more of the conductive columns can further comprise orthogonal springs 114 (only two of which on column 108 are labeled for simplicity). These springs 114 are referred to herein as "orthogonal," because as will be understood, they press the surface of the expansion card backplate 221 in a direction at right angles to the plane of the backplate planar panel surface 222.

As is readily understood, as only a limited number of openings can be provided in the enclosure 104 for expansions cards, (e.g., from the perspective of FIG. 2) only the right side of a leftmost conductive column forms the left side of a leftmost opening, and similarly only the left side of a rightmost conductive column forms the right side of a rightmost opening. Thus, such a leftmost (or rightmost) "end" column need not have any particular width, but is still referred to as a "column" herein. Further, because there is no expansion card opening on an end column's one side (the side opposite the leftmost or rightmost) opening), such an end column need not deal with spring contacts on this one side, although they may be present and unused.

Figure 2:
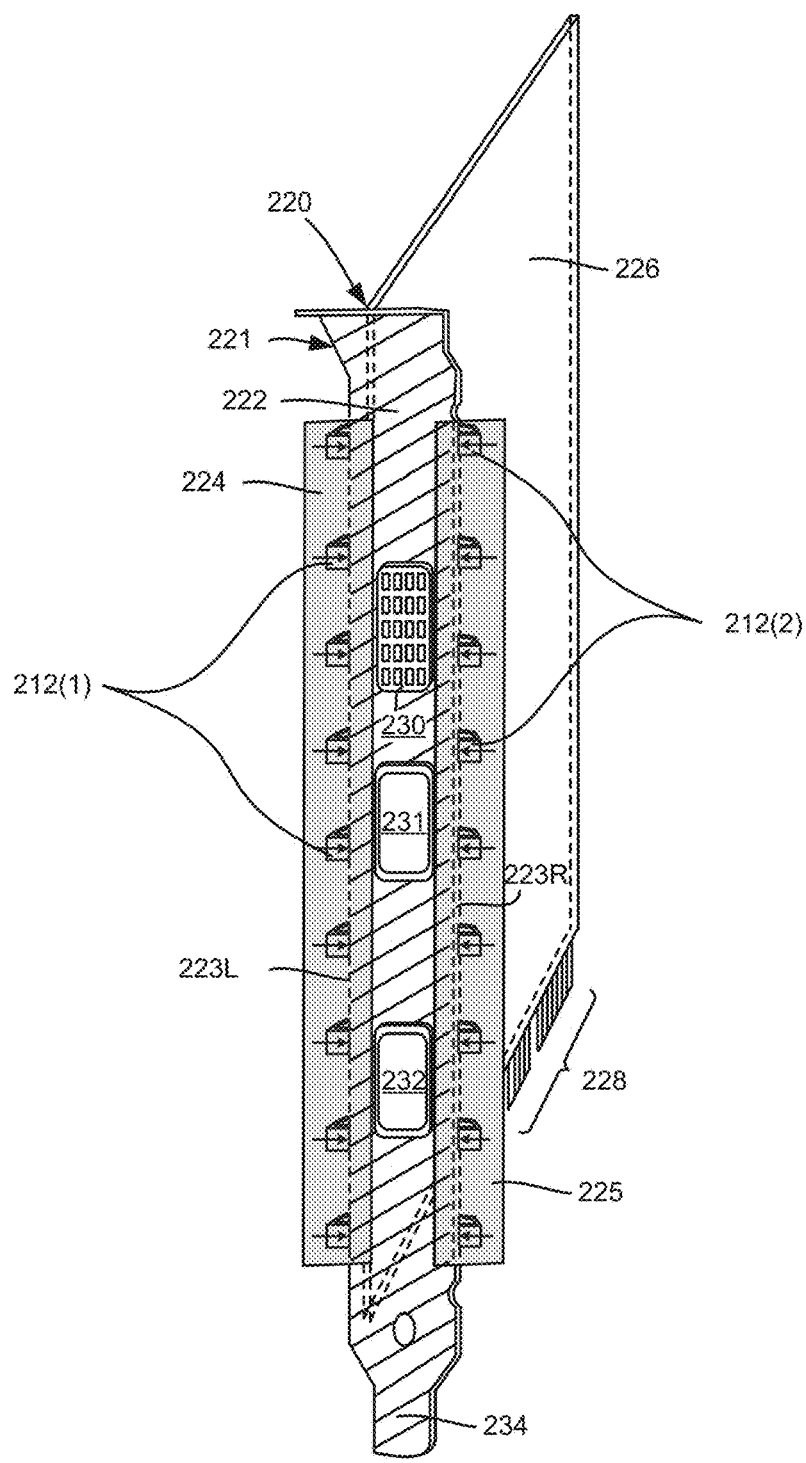
FIG. 2 is an example perspective, partial representation of an expansion card positioned between two conductive columns that include planar spring contacts, according to one or more example implementations.

FIG. 2 shows an expansion card 220 including a backplate 221, with longitudinally descending side edges 223L and 223R coupled to two conductive columns 224 and 225 (shown shaded and partially transparent) and thereby covering the opening in the enclosure. The (partially transparent) conductive columns 224 and 225 show the planar springs, two of which are labeled 212(1) on conductive column 224 and two of which are labeled 212(2) on conductive column 225. It is understood that when the expansion card is properly inserted, the planar springs (e.g., 212(1) are compressed to force (in the direction of the small left-to-right arrows, which is along the plane of the backplate surface) the edge 223L of the backplate 221 into the springs (e.g., 212(2)) on the opposite edge 223R of the backplate 221, and vice-versa (in the direction of the small right-to-left arrows), thereby facilitating electrical contact with the conductive columns 224 and 225, enhancing EMR shielding. Note that the longitudinally descending side edges 221L and 223R of the backplate 221 make contact with the planar springs 212(1) and 212(2), respectively.

As is known, the expansion card has a circuit board 226 typically with electronic circuitry and possibly other components such as a heat sink (not shown), and connector contacts 228 that mate with a connector slot (not shown) when fully inserted into an enclosure. The backplate 221 has a planar surface 222 with front and back panels, and has interface connectors or the like (230-232 are exemplified) through the planar surface for interfacing/coupling external components (not shown) to the expansion card circuitry.

As is known, with PCI and PCIe®, standards define the various sizes and shapes for the connectors, backplate, enclosure opening size and so on. For example, when inserted into an enclosure, a lower tab-like portion 234 of the backplate 221 helps secure the lower end of the backplate 221 to the enclosure, and a screw or similar fastening device (not shown) helps secure the upper end of the backplate 221 to the enclosure. It should also be noted that "blank" cover backplates (e.g., without attached circuit boards) are used to cover openings that are not used for expansion cards, but similarly are contacted by the planar contacts when blocking the opening to help prevent radiation emission.

Figure 3:
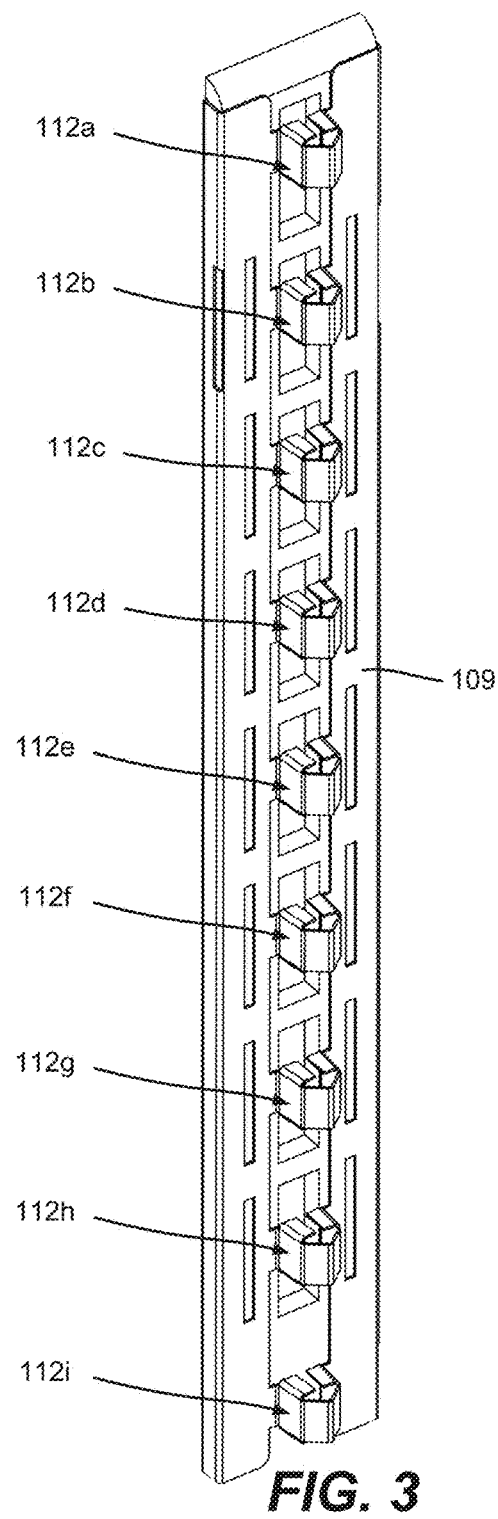
FIG. 3 is an example perspective view representation of a conductive column that includes planar spring contacts, according to one or more example implementations.

FIG. 3 shows an example of one implementation of a conductive column, e.g., the conductive column 109 of FIG. 1. In this example, there are nine planar springs 112a-112i longitudinally spaced generally evenly along the conductive column 109. The springs 112a-112i may be of any suitable conductive, deformable material, such as similar to (or part of) the sheet metal that typically is used to form the conductive column. As is understood, any practical number of planar springs may be present, e.g., including as little as one (likely relatively long) spring, as long as the planar springs fit the desired dimensions and are not too far apart to allow unacceptable levels of electromagnetic radiation to escape.

Figure 4:
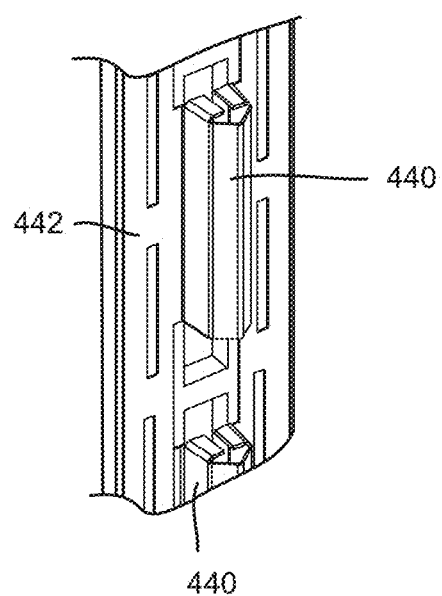
FIG. 4 is an example perspective, partial view representation of a conductive column that includes planar spring contacts, including at least one relatively elongated planar spring contact, according to one or more example implementations.

Thus, as is further understood, a planar spring contact or set of contacts can take alternative forms. For example, as represented by the (relatively) elongated planar spring contact 440 on the (partially represented) conductive column 442 in FIG. 4, the longitudinal lengths of the springs can vary in different implementations. Moreover, the longitudinal lengths of the springs can vary within the same column. For example, a column may alternate between having long and short longitudinally arranged planar spring contacts; e.g., the planar spring contact 444 (only part of which is shown) can be longitudinally longer than or shorter than the planar spring contact 440.

Figure 5:
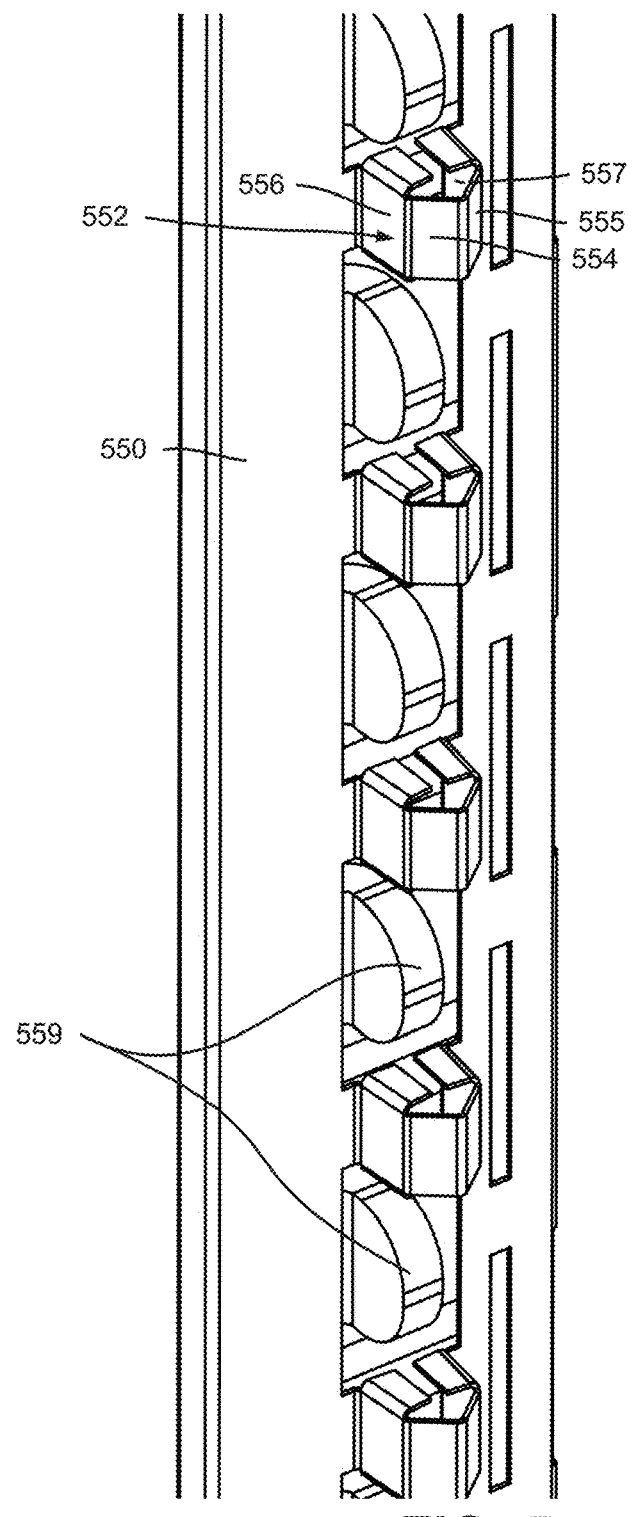
FIG. 5 is an example perspective, partial view representation of a conductive column that includes planar spring contacts, and orthogonal contacts longitudinally between the planar spring contacts, according to one or more example implementations.

FIG. 5 shows an example of how the shape of a planar spring contact on a conductive column 550 can be used to assist a user (or machine) with the insertion of an expansion card. In one or more implementations, at least one planar spring contact such as the planar spring contact 552 comprises first and second angled guide portions 554 and 555, respectively, and first and second protruding contact portions 556 and 557, respectively, (having a more orthogonal angle relative to the plane of the backplate surface than the angles of the angled guide portions).

As can be readily appreciated, one of the angled portions (e.g., the first angled portion 554) guides a longitudinal side edge of a backplate of a card panel into contact with the first protruding contact portion 554 (the first angled portion 554 pushes it leftward from the perspective of FIG. 5). Pressure from the opposite longitudinal side edge of the backplate causes the spring to deform to an appropriate extent, thereby facilitating contact. A different expansion card is similarly guided rightward by the angled portion 555 so as to make contact with and deform the second contact portion 557.

FIG. 5 also shows an example of an implementation in which orthogonal spring contacts 559 (only two of those shown are labeled for simplicity) are incorporated into or coupled to the conductive column 550. This corresponds to an existing solution, which as is known, causes the portion of the expansion card backplate surface portion that overlaps the conductive column to be in contact with the conductive column when the expansion card is properly inserted.

In the example of FIG. 5, the orthogonal spring contacts are shown as spaced between the planar spring contacts slightly to one side thereof (e.g., the left side in FIG. 5). For example, if the conductive column is the one that forms the last opening, such as the rightmost conductive column with the rightmost opening on the conductive column's left, only one side of the column overlaps with a backplate surface portion, and thus only one side of the conductive column 550 (the left side in FIG. 5) may have orthogonal contacts. For manufacturing purposes, however, a conductive column may have orthogonal contacts on both sides, even if only one side can be used.

Figure 6:
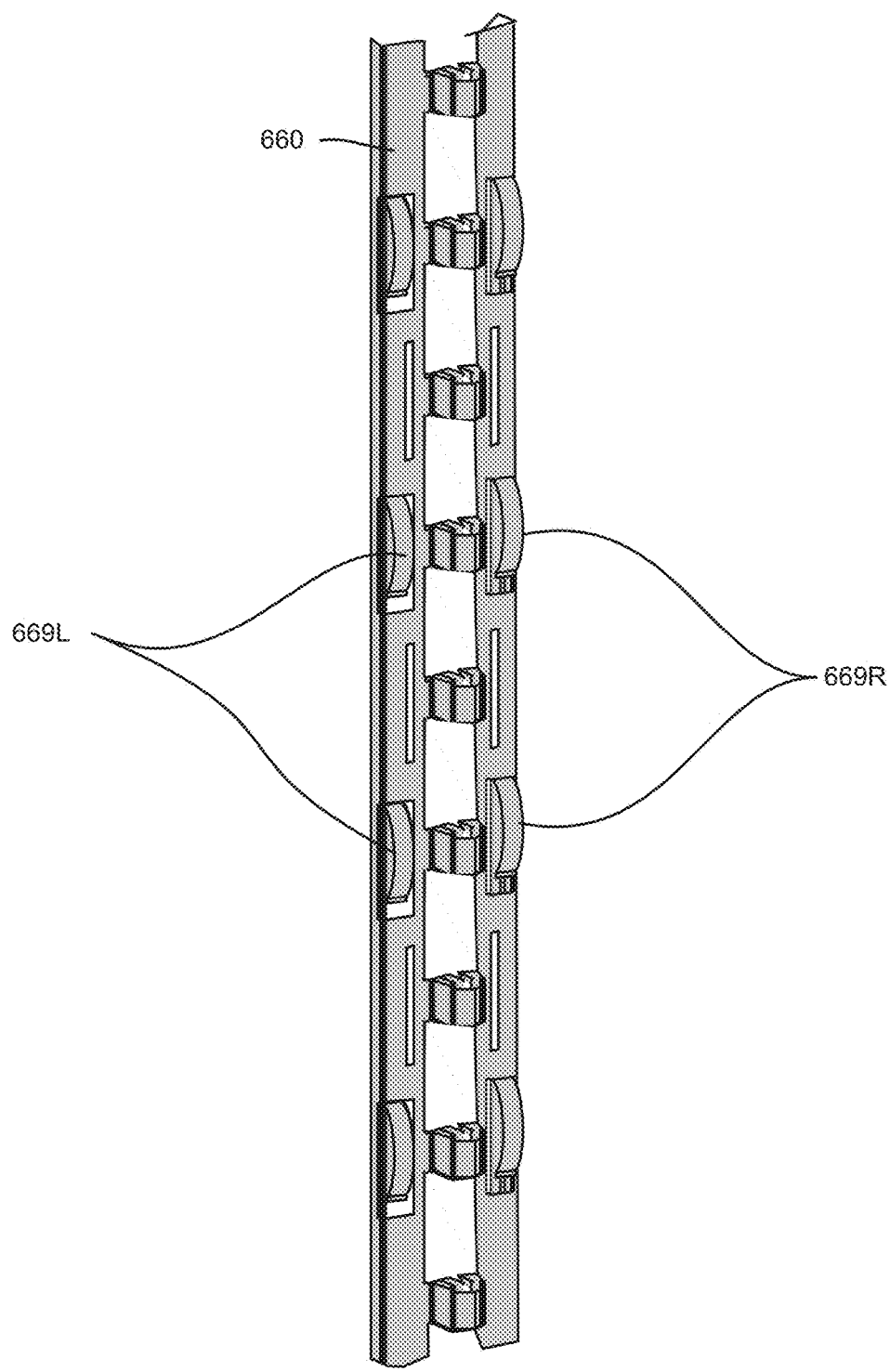
FIG. 6 is an example, partial perspective view representation of a conductive column that includes planar spring contacts and pairs of orthogonal contacts proximate and generally longitudinally parallel to some of the planar spring contacts, according to one or more example implementations.

FIG. 6 shows an alternative conductive column 660 having planar spring contacts and both left and right side orthogonal spring contacts 669L and 669R (only two of those shown on each side are labeled for simplicity), respectively. In this example, the orthogonal spring contacts are generally longitudinally parallel to some of the planar spring contacts (alternate planar spring contacts are skipped). For example, such a conductive column 660 is designed to be used between two openings in the enclosure, with left and right backplates in electrical contact with the planar springs and orthogonal spring contacts on both the left and right sides of the conductive column 660.

As is understood, further alternative implementations are feasible. As one non-limiting example, there may be implementations with orthogonal spring contacts parallel to planar spring contacts without skipping, on one side or both, and so on. As another non-limiting example, there may be implementations with orthogonal spring contacts that are on both sides between the planar spring contacts. As yet another non-limiting example, there may be implementations with longitudinally spaced orthogonal spring contacts that are angled differently (e.g., perpendicular to) relative to the length of the conductive column, e.g., positioned between at least some of the planar spring contacts. There may be implementations with orthogonal spring contacts that are generally not related to the position or number of the planar spring contacts, and so on.

Figure 7:
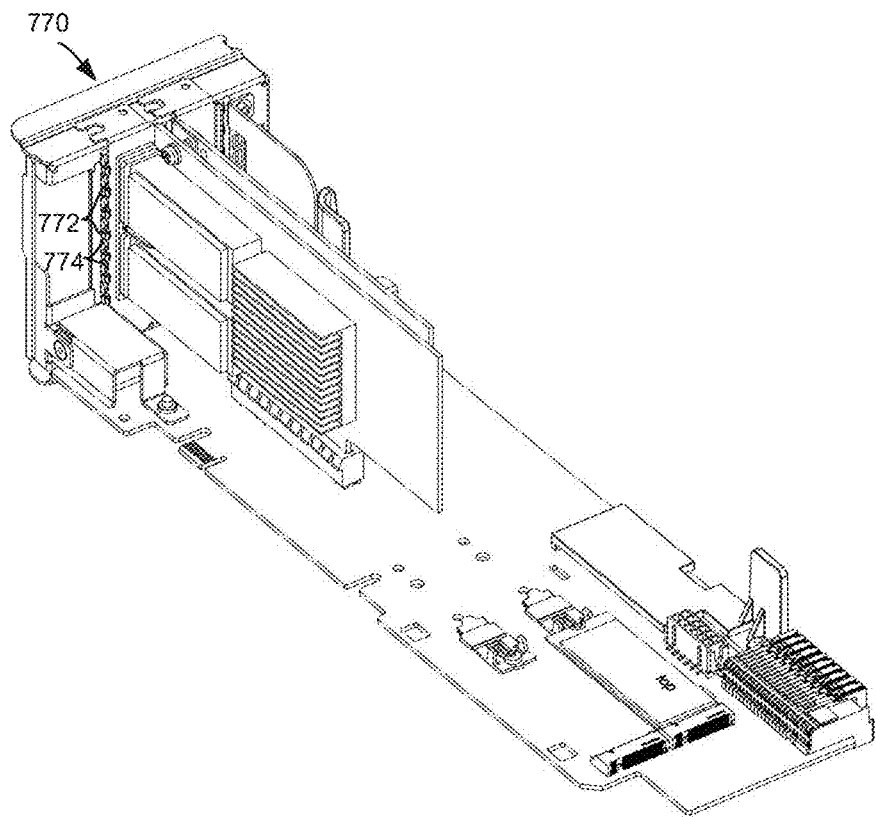
FIG. 7 is an example perspective, partial view representation of a partial computer housing that comprises an expansion card enclosure comprising conductive columns, with planar springs, between which expansion cards are inserted, according to one or more example implementations.
Figure 8:
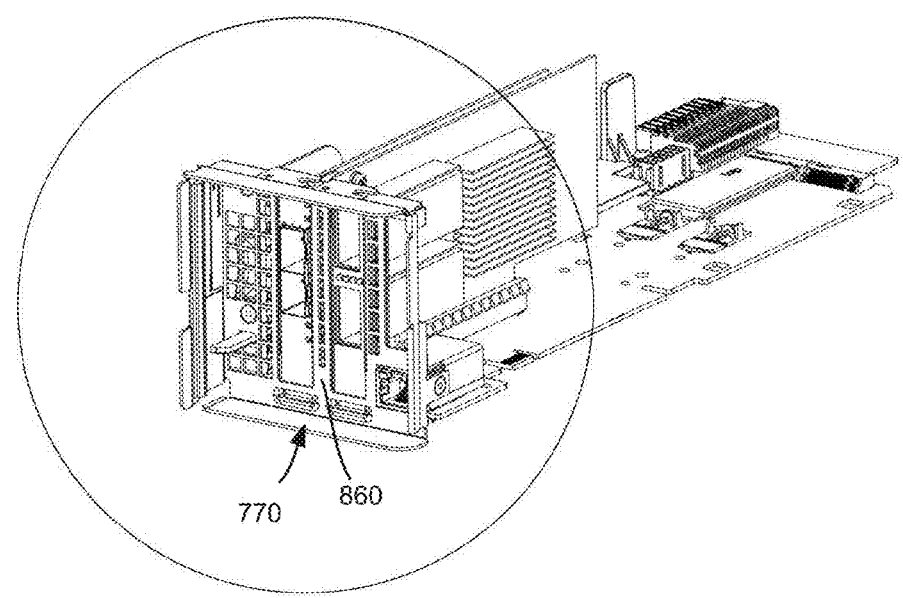
FIG. 8 is an example partial view representation (from a generally opposite perspective of FIG. 7) of a partial computer housing that comprises an expansion card enclosure comprising conductive columns, with planar springs, between which expansion cards are inserted, according to one or more example implementations.
Figure 9:
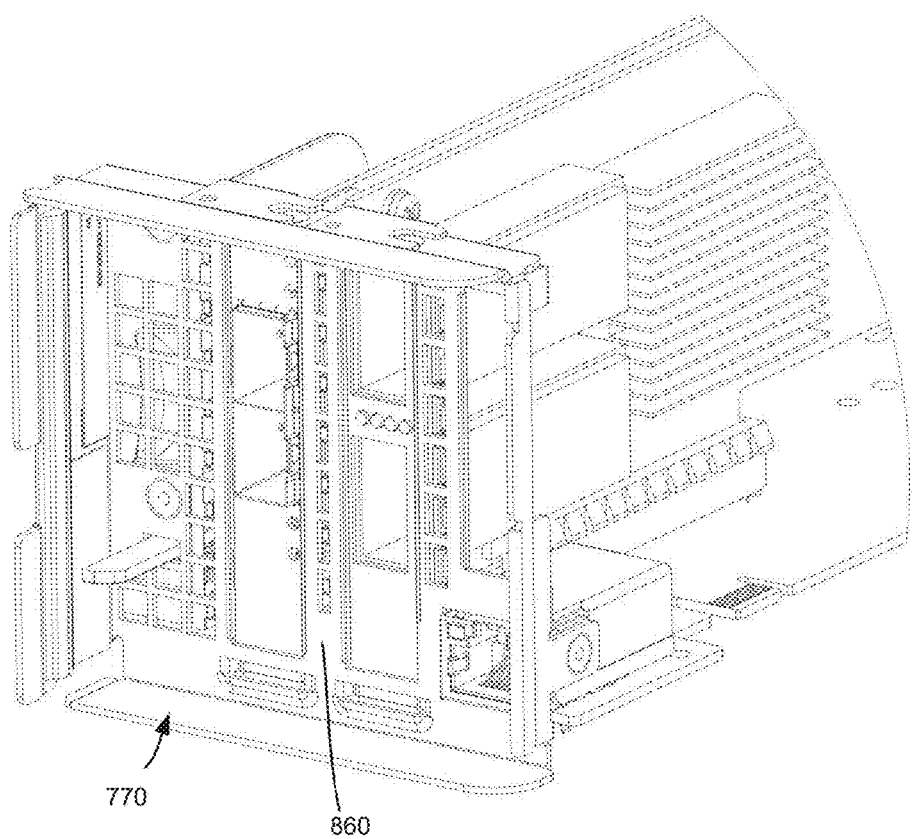
FIG. 9 is an example representation of an enlarged (corresponding to the circled) portion of FIG. 8, according to one or more example implementations.

FIGS. 7, 8 and 9 each show two expansion cards inserted into a card enclosure/computer housing 770. FIG. 7 is shown from the perspective of inside the computer housing 770, whereas FIG. 8 shows a generally opposite perspective from outside the housing 770, with FIG. 9 being an enlarged view corresponding to the circled portion of FIG. 8. Two of the planar spring contacts (collectively labeled 772) and two of the orthogonal spring contacts (collectively labeled 774) are indicated in FIG. 7. A conductive column 860 that forms a side of each of two enclosure openings, covered by backplates of the inserted expansion cards, is shown in FIGS. 8 and 9, with the planar (and orthogonal) contacts on the opposite surface of the conductive column 860. In general, the electrical contacts resulting from the planar spring contacts help form an improved Faraday cage.

Figure 10:
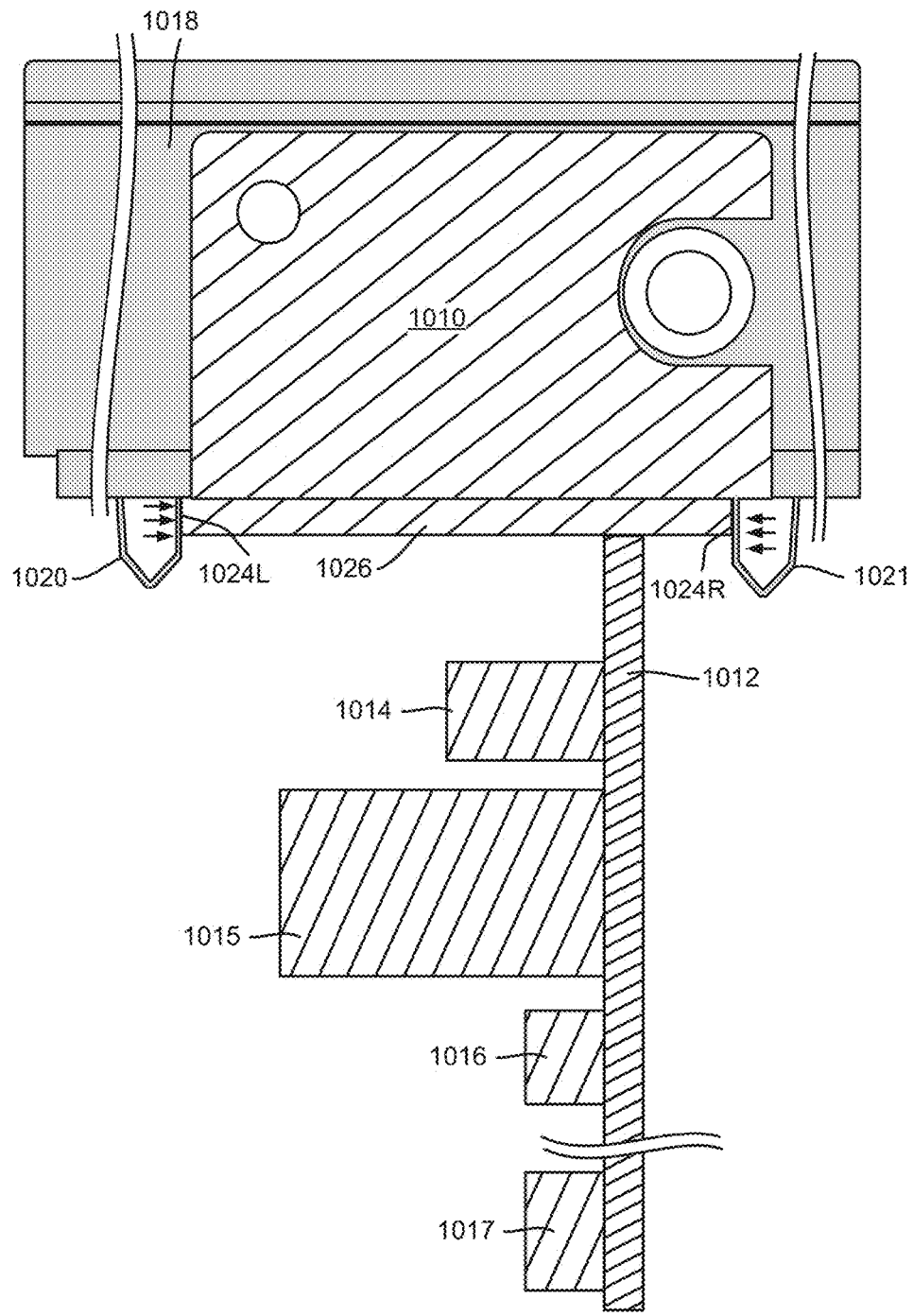
FIG. 10 is an example partial top view representation of an expansion card with its backplate positioned between two conductive columns that show topmost planar spring contacts deformed to an extent via the backplate, according to one or more example implementations.

FIG. 10 is a representation (not intended to be to scale) of a top view of an inserted expansion card comprising backplate top surface 1010, circuit board 1012 and circuitry or the like 1014-1017. The shaded area 1018 corresponds to the enclosure/conductive columns that form an opening (not shown) for the expansion card interfaces (also not shown).

As represented in FIG. 10, planar spring contacts 1020 and 1021 are shown as generally deformed by the backplate. More particularly, the planar spring contacts 1020 and 1021 provide opposing spring forces (in the direction of the arrows) on the longitudinally descending side edges 1024L and 1024R of a longitudinally descending part 1026 of the backplate.

Figure 11:
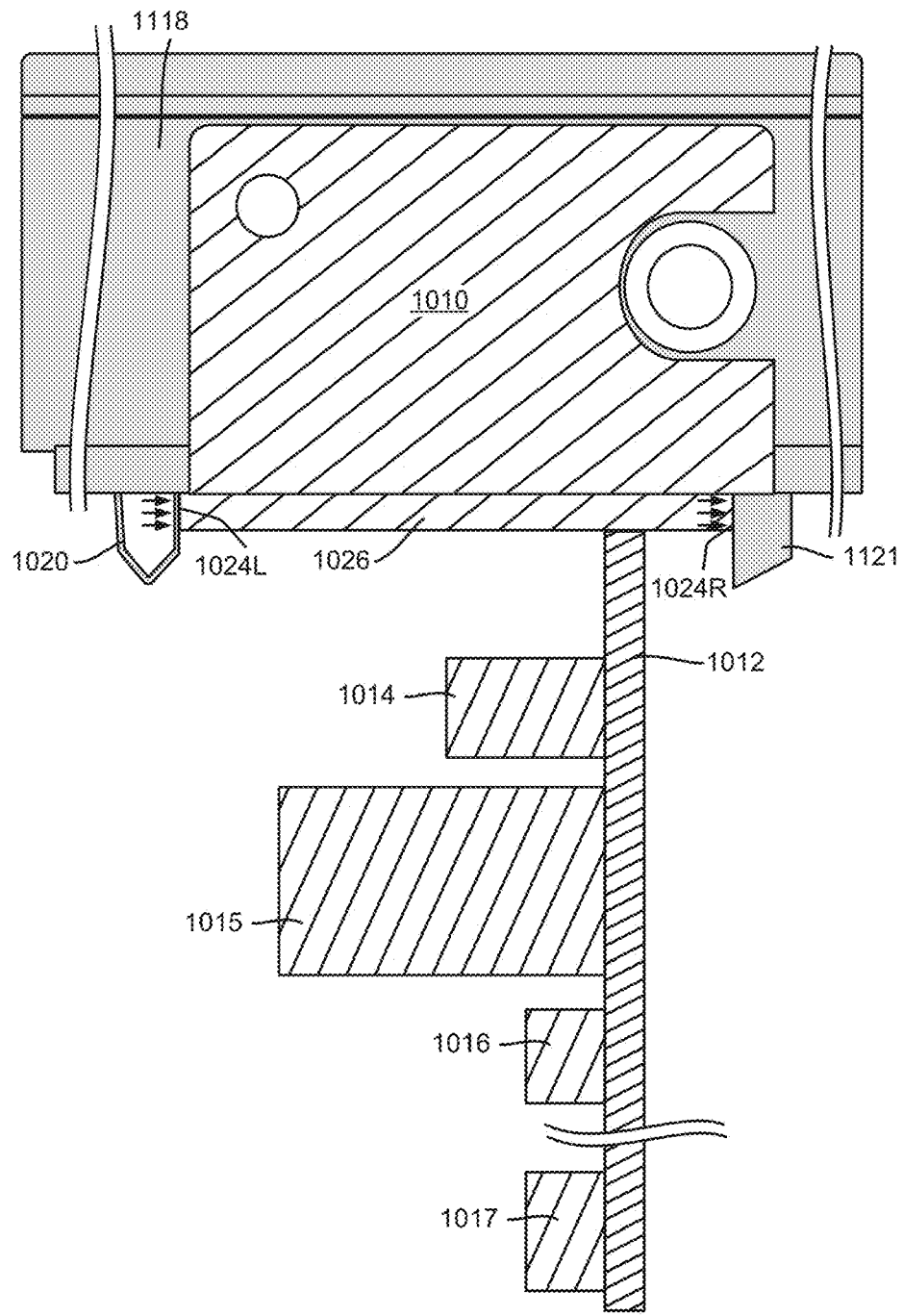
FIG. 11 is an example partial top view representation of an expansion card with its backplate positioned between a conductive column that shows a topmost planar spring contact deformed to an extent via the backplate, which presses one side of the backplate so that the other side of the backplate contacts an electrical shielding conductor, according to one or more example implementations.

FIG. 11 is similar to FIG. 10 and uses like numbering. A difference, however, is that instead of a planar spring contacting the right side edge (from the perspective of the drawing) of the backplate, an electrical shielding conductor 1121 is present, (e.g., a generally longitudinally elongated contact or set of longitudinally spaced contacts), which may or may not be a deformable spring. The spring force from the spring 1020 translates through the backplate to make contact with the electrical shielding conductor 1121, as represented by the arrows. For example, the rightmost opening (from the perspective of FIG. 11) in an enclosure will not have another expansion card to the right of it, and thus instead of a column with planar (and possibly orthogonal) springs, the right edge of the opening may be any suitable contact surface, such as part of a side of a card cage "end" column.

As can be seen, there is described a technology that assists in electrical shielding to help reduce electromagnetic radiation emissions from computer housing/card enclosure by having planar spring contacts make electrical contact with the side edges of a backplate of an expansion card (or a blank cover backplate). The technology does not change the effort needed by a user, (and in one or more implementations having angled guide planar contact spring portions even assists the user), in inserting an expansion card into a card slot. The technology does not change any existing standards for expansion cards, and instead only needs to have relatively straightforward manufacturing changes made with respect to conductive columns of card enclosures to provide better electrical contact shielding surrounding card enclosure/computer housing openings.

While the invention is susceptible to various modifications and alternative constructions, certain illustrated implementations thereof are shown in the drawings and have been described above in detail. It should be understood, however, that there is no intention to limit the invention to the specific forms disclosed, but on the contrary, the intention is to cover all modifications, alternative constructions, and equivalents falling within the spirit and scope of the invention.

In addition to the various implementations described herein, it is to be understood that other similar implementations can be used or modifications and additions can be made to the described implementation(s) for performing the same or equivalent function of the corresponding implementation(s) without deviating therefrom. Still further, multiple processing chips or multiple devices can share the performance of one or more functions described herein, and similarly, storage can be effected across a plurality of devices. Accordingly, the invention is not to be limited to any single implementation, but rather is to be construed in breadth, spirit and scope in accordance with the appended claims.

What is claimed is:

1. A system, comprising:
a conductive column that forms a first longitudinal side of an opening in a device housing card enclosure; and
a planar spring contact electrically coupled to the conductive column and that facilitates electrical contact between the conductive column and a first longitudinal side edge of a backplate surface panel of a backplate of an expansion card when the expansion card is inserted in the device housing card enclosure, wherein the planar spring contact deforms to force a second longitudinal side edge of the backplate surface panel in a first planar direction, relative to a plane of the backplate surface panel of the backplate, into an opposing shielding conductor that opposes the second longitudinal side edge of the backplate surface panel.

2. The system of claim 1, wherein the conductive column comprises a first conductive column, and wherein the opposing shielding conductor comprises a second planar spring contact component electrically coupled to a second conductive column of the device housing card enclosure.

3. The system of claim 1, further comprising an orthogonal spring contact electrically coupled to the conductive column, the orthogonal spring contact configured to facilitate electrical contact with a part of the backplate surface panel of the backplate of the expansion card when the expansion card is inserted in the card enclosure.

4. The system of claim 1, wherein the planar spring contact comprises spring devices spaced apart longitudinally along the conductive column.

5. The system of claim 1, wherein the planar spring contact comprises at least one deformable protrusions longitudinally positioned along the conductive column and protruding towards the expansion card.

6. The system of claim 1, wherein the planar spring contact comprises at least one spring device substantially centered on the conductive column and extending towards the expansion card.

7. The system of claim 1, wherein the planar spring contact comprises at least one spring device comprising a contact portion and an angled guide portion that is angled at an angle relative to the plane of the backplate surface panel of the backplate, and wherein the contact portion has a more orthogonal angle, relative to the plane of the backplate surface panel of the backplate, than the angle of the angled guide portion, relative to the plane of the backplate surface panel of the backplate.

8. The system of claim 1, wherein the opening in the device housing card enclosure and the expansion card comply with at least one of a peripheral component interface standard or a peripheral component interface Express® standard.

9. A system, comprising:
a card enclosure of a computer housing that houses one or more expansion cards, the card enclosure comprising:
at least one pair of spaced-apart conductive columns that make electrical contact with the card enclosure, and that form longitudinal sides of one or more enclosure openings in the card enclosure corresponding to the one or more expansion cards,
a first conductive column that forms a first longitudinal side, of the longitudinal sides, of an opening of the one or more enclosure openings in the card enclosure, and
a second conductive column that forms a second longitudinal side of the opening of the one or more enclosure openings in the card enclosure, wherein the second longitudinal side of the opening is opposite the first longitudinal side of the opening,
wherein the first conductive column comprises a first planar spring contact component that facilitates electrical contact between the first conductive column and a first longitudinal side edge of a backplate surface panel of a backplate of an expansion card of the one or more expansion cards when inserted into the card enclosure, and forces a second, opposite longitudinal edge of the backplate surface panel into electrical contact with a second planar spring contact component of the second conductive column, and wherein the second planar spring contact component is configured to urge the first longitudinal edge of the backplate surface panel into electrical contact with the first planar spring contact component of the first conductive column.

10. The system of claim 9, further comprising an orthogonal spring contact component electrically coupled to the first conductive column, the orthogonal spring contact component configured to facilitate electrical contact with an overlapping part of the backplate surface panel of the backplate of the expansion card when inserted into the card enclosure.

11. The system of claim 9, wherein the first planar spring contact component comprises a group of spring devices substantially centered on the first conductive column and spaced apart longitudinally along the first conductive column.

12. The system of claim 9, wherein the first planar spring contact component comprises deformable protrusions longitudinally positioned along the first conductive column.

13. The system of claim 9, wherein the first planar spring contact component comprises a spring device comprising a first contact portion and a first angled guide portion positioned at a first angle with respect to a plane of the backplate surface panel of the backplate, wherein the first contact portion has a more orthogonal angle, relative to the plane of the backplate surface panel of the backplate, than the first angle of the first angled guide portion, relative to the plane of the backplate surface panel of the backplate, wherein the spring device further comprises a second contact portion and a second angled guide portion positioned at a second angle with respect to the plane of the backplate surface panel of the backplate, and wherein the second contact portion has a more orthogonal angle, relative to the plane of the backplate surface panel of the backplate, than the second angle of the second angled guide portion, relative to the plane of the backplate surface panel of the backplate, and wherein the second angled guide portion is coupled to the first angled guide portion.

14. A system, comprising:
a planar spring contact electrically coupled to a conductive column of a card enclosure of a device housing, wherein the conductive column forms a first longitudinal side of an opening in the card enclosure, the planar spring contact configured to:
facilitate electrical contact with a first longitudinal conductive side edge of a conductive backplate of an inserted expansion card that has been inserted in the opening; and
press the first longitudinal conductive side edge in a first planar direction, relative to a plane of a surface panel of the conductive backplate, to have a second, opposite longitudinal conductive side edge of the surface panel of the conductive backplate press against a shielding conductor that is proximate a second, opposite longitudinal side of the opening in the card enclosure.

15. The system of claim 14, wherein the conductive column comprises a first conductive column, and wherein the shielding conductor comprises a second planar spring contact electrically coupled to a second conductive column of the card enclosure of the device housing.

16. The system of claim 14, further comprising an orthogonal spring contact electrically coupled to the conductive column, the orthogonal spring contact configured to facilitate electrical contact with at least part of the surface panel of the conductive backplate of the inserted expansion card when the inserted expansion card is inserted in the opening of the card enclosure.

17. The system of claim 14, wherein the planar spring contact comprises a plurality of spring devices spaced apart longitudinally along the conductive column.

18. The system of claim 14, wherein the planar spring contact comprises one or more deformable protrusions longitudinally positioned along the conductive column and protruding towards the inserted expansion card.

19. The system of claim 14, wherein the planar spring contact comprises a spring device substantially centered on the conductive column and extending towards the inserted expansion card.

20. The system of claim 14, wherein the planar spring contact comprises a spring device comprising a contact portion and an angled portion set at an angle relative to the plane of the surface panel of the conductive backplate, wherein the contact portion has a more orthogonal angle, relative to the plane of the surface panel of the conductive backplate, than the angle of the angled portion, relative to the plane of the surface panel of the conductive backplate.

* * * * *